May 5, 1970 H. E. MARTIN 3,510,684
SOLID STATE DIFFERENTIAL INPUT CHOPPER
Filed July 3, 1967
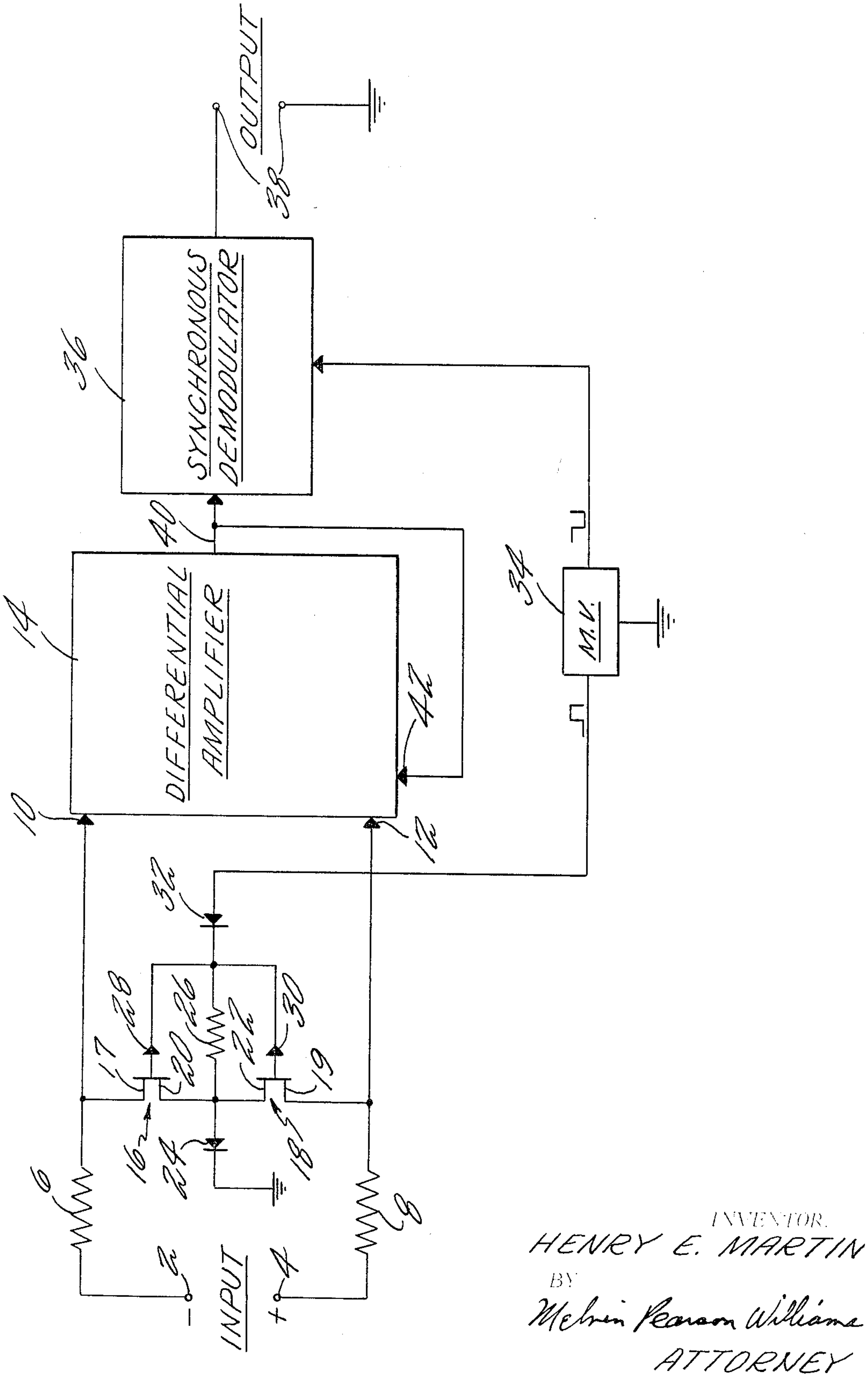
INVENTOR.
HENRY E. MARTIN
BY
Melvin Pearson Williams
ATTORNEY 3,510,684

SOLID STATE DIFFERENTIAL INPUT CHOPPER

Henry E. Martin, Wapping, Conn., assignor to United Aircraft Corporation, East Hartford, Conn., a corporation of Delaware Filed July 3, 1967, Ser. No. 650,694
Int. Cl. H03k *17/00*
U.S. Cl. 307—240 1 Claim

ABSTRACT OF THE DISCLOSURE

A pair of field-effect transistors are serially connected, source to source, between the input terminals of a differential amplifier. The gates are connected through a common resistance to the junction of the two sources; the sources are referenced to ground through a diode, and the gates are driven through a diode by a multivibrator, the complementary output of which may be utilized to operate an out-of-phase synchronous demodulator in a well known way.

BACKGROUND OF THE INVENTION

Field of invention

This invention relates to amplifier input choppers, and more particularly to a solid state differential input chopper.

Description of the prior art

It is well known that a D.C. amplifier having low drift characteristics is readily formed by utilizing an A.C. amplifier which responds to a chopped-up D.C. input signal. Such devices utilizing electromechanical choppers are well known. The use of the electromechanical chopper provides isolation between the chopper control circuitry and the input circuitry, which includes only the armature and static contacts for the armature, and not the electromagnetic driving circuit. Also, since the electromechanical driving circuit is completely isolated from the signal circuit in an electromechanical chopper, there is absolutely no chance for the input signal to achieve sufficiently wide voltage swings so as to falsely operate the chopper. Additionally, the electromechanical chopper permits operation above ground, so that there is no loading of the source of input signals as a result of shorting one or the other input terminal to ground periodically in response to chopper action.

As a natural consequence of the development of the solid state circuit art, amplifier input chopper circuits utilizing only passive elements and solid state components have been developed, thus eliminating the use of the electromechanical chopper. However, no solid state input chopper circuitries have yet been devised which have the advantages set out hereinbefore with respect to electromechanical choppers. Although good speed response, small size, and high reliability attend the solid state choppers known in the art, such devices require the use of transformers, or have other disadvantages such as chopper control current flowing in the signal path, leakage current flowing in the signal path, shorting of one or both terminals to ground as a result of chopper action, and false triggering of the chopper due to the imposition of sufficient voltages to the collectors, emitters, sources or drains of various solid state devices so as to cause false trigegring of the chopper action as a result of wide swings and input signal.

SUMMARY OF INVENTION

The object of the invention is to provide a solid state amplifier input chopper having the circuit operation advantages of an electromechanical chopper, as described hereinbefore.

According to the present invention, the input terminals of a differential amplifier are periodically short circuited together while being buffered from ground by solid-state devices which are so arranged and driven that no chopper control current flows in the input signal path, said solid-state devices being so poled that a false turn on of either of the devices is impossible because the input signal cannot become a turn on or off signal to falsely trigger the chopper action.

The foregoing and other objects, features and advantages of the present invention will become more apparent in the light of the following detailed description of a preferred embodiment thereof as illustrated in the accompanying drawing.

BRIEF DESCRIPTION OF THE DRAWING

The sole figure herein comprises a simplified schematic block diagram of an embodiment of the present invention.

DESCRIPTION OF THE PREFERRED EMBODIMENT

Referring to the figure, a direct current input signal may be applied across a pair of terminals 2, 4 and thence through respective resistors 6, 8 to corresponding inputs 10, 12 of a differential amplifier 14. Chopping of the input signal is achieved by a pair of field effect transistors 16, 18 which are connected back to back with their drains 17, 19 connected to the amplifier inputs 10, 12. The sources 20, 22 are commonly connected to the junction of a diode 24 and a resistor 26. At the opposite end of the resistor 26, both gates 28, 30 are connected in common along with the cathode of a diode 32. The anode of the diode 32 is connected to a multivibrator 34, the opposite side of which may be utilized to control a synchronous out-of-phase demodulator 36. The synchronous demodulator 36 will provide output signals to a pair of output terminals 38. The output 40 of the differential amplifier 14 is applied to the synchronous demodulator 36 and may also be utilized so as to provide gain control, stabilizing feedback over a feedback line 42 to one of the inputs (12) of the differential amplifier 14, or in any other suitable fashion. It will be appreciated that the differential amplifier 14, the synchronous demodulator 36, and the multivibrator 34 are well-known components of a chopper in D.C. amplifier, and the nature of these circuits is not germain to the present invention.

In operation, a positive signal from the multivibrator 34 will forward bias the diode 32 and the diode 24 causing a current flow through resistor 26 which provides a suitable positive gate signal to each of the depletion type field-effect transistors 16, 18. This supplies a suitable gate voltage (between gate 28 and source 20 and between gate 30 and source 22) so as to turn off each of the field-effect transistors 16, 18 so that the resistance between the drains 17, 19 and the corresponding sources 20, 22 is on the order of many megohms rather than ohms. A zero signal from the multivibrator 34 will cut off diodes 24 and 32 and provide zero gate voltage to the gates of depletion type field effect transistors 16 and 18, turning them ON into full conduction so that the resistance between drains 17, 19 and the corresponding sources 20, 22 is in the order of ohms rather than megohms. With suitable resistors 6, 8 and a suitable input impedance across the input 10–12 of differential amplifier 14, the conduction of the field-effect transistors 16, 18 amounts substantially to a short circuit across the input to the differential amplifier 14.

Notice that the chopper control current passes through diodes 24, 32 and resistor 26, to ground, and none of this control current flows through either of the signal paths between the terminals 2, 4 and the differential amplifier inputs 10, 12. This is one of the features of the present invention.

Note also that regardless of the potential between the input terminals 2, 4, this potential, when kept below the break-down limits of the device, cannot falsely turn on the field-effect transistors 16, 18, because there is no method of applying a gate to source voltage as a result of these signals. Assuming that the input signal is a differential signal with a negative potential applied to terminal 2 and a positive potential applied to terminal 4, with these potentials balanced about a ground reference, when the field-effect transistors 16, 18 are conducting, the common source point at the anode of diode 24 will be nominally at ground potential, so there is no tendency to short one or the other of them directly to ground, but rather the effect is the same as if they are connected to each other through the resistors 6, 8. On the other hand, if a terminal 4 is essentially grounded and a negative input signal is applied to terminal 2, then the diode 24 will prevent any current flow to ground through the chopper, since the division of this negative voltage between terminal 2 and terminal 4 will cause substantially half that negative voltage to be applied to the anode of diode 24 due to the voltage division action of the resistors 6, 8 along with the drain-source resistance of each of the transistors 16, 18. In such a case, there is absolutely no tendency to short the signal to ground through the chopper. In other words, the action of the chopper is to short circuit the input to the differential amplifier and not to short circuit the input signal source. This is another feature of the present invention. Another related feature is that the configuration herein allows high input impedances, whereby a D.C. amplifier operated with an input controlled by means of the present invention will not load the source of signal being amplified.

Although depletion type field-effect transistors are preferably used herein because of their relatively low noise characteristic which results from majority carrier conduction, other suitable field-effect transistors, such as the enhancement type, may be utilized when appropriate for certain purposes.

Although the invention has been shown and described with respect to a preferred embodiment thereof, it should be understood by those skilled in the art that the foregoing and other changes and omissions in the form and detail thereof may be made therein without departing from the spirit and scope of the invention.

Having thus described typical embodiments of my invention, that which I claim as new and desire to secure by Letters Patent of the United States is:

1. A solid state input signal chopper connected across a pair of differential input signal lines of a DC chopper amplifier and working with respect to ground, comprising:

a pair of field effect transistors each including a gate electrode and a pair of current conducting electrodes comprising a source and a drain, the gate electrode of said transistors being connected together at a first junction, one of said current conducting electrodes of a given type for each of said transistors being connected to a corresponding one of the input lines of said DC chopper amplifier, the other of of said current conducting terminals of each of said transistors being connected together at a second junction, whereby said transistors are connected in series across said input lines;

an impedance interconnecting said first junction and said second junction;

a multivibrator control signal source for driving said transistors with a potential of a given polarity proper to cause said transistors to assume a conducting state when applied to the gate electrodes thereof;

a first diode interconnecting said control signal source and said first junction and poled so as to be forwardly biased in response to a signal from said source of said given polarity; and a second diode connecting said second junction to ground and poled so as to be forwardly biased in response to a signal from said control signal source passing through said first diode.

References Cited

UNITED STATES PATENTS

| | | | |
|---|---|---|---|
| 2,862,171 | 11/1958 | Freeborn | 307—317 XR |
| 3,018,391 | 1/1962 | Lindsay et al. | 330—10 XR |
| 3,215,859 | 11/1965 | Sorchych | 307—251 |

DONALD D. FORRER, Primary Examiner

J. ZAZWORSKY, Assistant Examiner

U.S. Cl. X.R.

307—251; 330—9, 10